United States Patent
Graef et al.

(10) Patent No.: US 7,941,732 B2
(45) Date of Patent: May 10, 2011

(54) METHOD AND APPARATUS FOR EVALUATING PERFORMANCE OF A READ CHANNEL

(75) Inventors: Nils Graef, Sunnyvale, CA (US); Zachary Keirn, Loveland, CO (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 12/750,049

(22) Filed: Mar. 30, 2010

(65) Prior Publication Data

US 2010/0185924 A1    Jul. 22, 2010

Related U.S. Application Data

(62) Division of application No. 11/068,224, filed on Feb. 28, 2005, now Pat. No. 7,730,384.

(51) Int. Cl.
*H03M 13/00* (2006.01)
(52) U.S. Cl. .................... 714/780; 714/763
(58) Field of Classification Search .................. 714/780, 714/763
See application file for complete search history.

(56) References Cited

U.S. PATENT DOCUMENTS

| | | | | |
|---|---|---|---|---|
| 4,340,963 A * | 7/1982 | Munday | | 714/785 |
| 4,404,674 A * | 9/1983 | Rhodes | | 714/793 |
| 4,500,994 A * | 2/1985 | McCallister et al. | | 714/794 |
| 5,093,842 A * | 3/1992 | Gimlin et al. | | 375/227 |
| 5,291,499 A * | 3/1994 | Behrens et al. | | 714/796 |
| 5,408,367 A * | 4/1995 | Emo | | 360/53 |
| 5,471,457 A * | 11/1995 | Bakx et al. | | 369/47.53 |
| 5,610,776 A * | 3/1997 | Oh | | 360/53 |
| 5,652,760 A * | 7/1997 | Yamashita et al. | | 714/704 |
| 5,786,951 A * | 7/1998 | Welland et al. | | 360/46 |
| 5,809,090 A * | 9/1998 | Buternowsky et al. | | 375/347 |
| 5,862,157 A * | 1/1999 | Bessios | | 714/799 |
| 5,930,448 A * | 7/1999 | Lee et al. | | 386/78 |
| 6,014,768 A * | 1/2000 | Lee et al. | | 714/795 |
| 6,016,463 A * | 1/2000 | Ng | | 702/69 |
| 6,029,264 A * | 2/2000 | Kobayashi et al. | | 714/755 |
| 6,134,280 A * | 10/2000 | Matui | | 375/341 |
| 6,240,055 B1 * | 5/2001 | Takamine et al. | | 369/44.29 |
| 6,246,041 B1 * | 6/2001 | Nakayama et al. | | 250/201.5 |
| 6,313,961 B1 * | 11/2001 | Armstrong et al. | | 360/46 |
| 6,545,830 B1 * | 4/2003 | Briggs et al. | | 360/31 |
| 6,765,507 B2 * | 7/2004 | Yokokawa et al. | | 341/50 |
| 6,785,077 B2 * | 8/2004 | Lim et al. | | 360/53 |
| 6,988,227 B1 * | 1/2006 | Perrott | | 714/704 |
| 7,281,175 B1 * | 10/2007 | Hayashi et al. | | 714/704 |
| 7,317,586 B1 * | 1/2008 | Egan et al. | | 360/39 |
| 2006/0195772 A1 * | 8/2006 | Graef et al. | | 714/795 |

* cited by examiner

*Primary Examiner* — Joseph D Torres
(74) *Attorney, Agent, or Firm* — Ryan, Mason & Lewis, LLP

(57) ABSTRACT

Methods and apparatus are provided for measuring the performance of a read channel. A number of detection techniques, such as SOVA and maximum-a-posteriori (MAP) detectors, produce a bit decision and a corresponding reliability value associated with the bit decision. The reliability value associated with the bit decision may be expressed, for example, in the form of log likelihood ratios (LLRs). The reliability value can be monitored and used as a performance measure. The present invention provides a channel performance measure that generally correlates directly to the BER but can be collected in less time.

9 Claims, 3 Drawing Sheets

METHOD AND APPARATUS FOR EVALUATING PERFORMANCE OF A READ CHANNEL

CROSS-REFERENCE TO RELATED APPLICATIONS

This application is a divisional of U.S. patent application Ser. No. 11/068,224 (now U.S. Pat. No. 7,730,384), filed Feb. 28, 2005, incorporated by reference herein.

FIELD OF THE INVENTION

The present invention relates generally to evaluating the performance of a read channel, and more particularly, to methods and apparatus for evaluating the performance of read channels that employ soft output Viterbi detection.

BACKGROUND OF THE INVENTION

A magnetic recording read channel converts an analog read channel into an estimate of the user data recorded on a magnetic medium. Read heads and magnetic media introduce noise and other distortions into the read signal. As the information densities in magnetic recording increase, the intersymbol interference (ISI) becomes more severe as well. In read channel chips, a Viterbi detector is typically used to detect the read data bits in the presence of intersymbol interference and noise.

The Soft Output Viterbi Algorithm (SOVA) is a well known technique for generating soft decisions inside a Viterbi detector. A soft decision provides a detected bit with a corresponding reliability. These soft decisions can be used by an outer detector to improve the error rate performance of the overall system. For a more detailed discussion of SOVA detectors, see, for example, J. Hagenauer and P. Hoeher, "A Viterbi Algorithm with Soft-decision Outputs and its Applications," IEEE Global Telecommunications Conference (GLOBECOM), vol. 3, 1680-1686 (November 1989).

Various parameters of a magnetic recording read channel are typically adjusted to improve the Bit Error Rate (BER) performance. While measuring the BER provides the most accurate measure of performance, the BER measurement is unduly time consuming. A number of techniques have been proposed or suggested for obtaining performance measures based on the mean squared error or other derivatives of an error term derived from decoding the bit sequence and then re-creating the ideal pattern. Although these techniques are generally fast, they are not guaranteed to correlate directly with the BER.

A need therefore exists for an improved method and apparatus for obtaining performance measures without measuring the BER. A further need exists for a method and apparatus for obtaining performance measures in a read channel that are directly correlated to BER but takes much less time to collect.

SUMMARY OF THE INVENTION

Generally, methods and apparatus are provided for measuring the performance of a read channel. A number of detection techniques, such as SOVA and maximum-a-posteriori (MAP) detectors, produce a bit decision and a corresponding reliability value associated with the bit decision. The present invention recognizes that the reliability value can be monitored and used as a performance measure. The present invention provides a channel performance measure that generally correlates directly to the BER but can be collected in less time.

According to one aspect of the present invention, the reliability values derived from the "soft_value" provided by a SOVA detector are monitored as a performance measure. The reliability values can be accumulated or used to generate a histogram (or both). In one exemplary implementation, a counter is configured to count the number of occurrences of the reliability in each of a number of threshold ranges. In this manner, a histogram of reliability values can be generated.

A more complete understanding of the present invention, as well as further features and advantages of the present invention, will be obtained by reference to the following detailed description and drawings.

DETAILED DESCRIPTION

As previously indicated, SOVA techniques produce both a bit decision and a corresponding reliability value associated with the bit decision. The present invention recognizes that the reliability value can be monitored and used as a performance measure. In particular, the present invention provides a channel performance measure that generally correlates directly to the BER but can be collected in less time. According to one aspect of the present invention, the reliability values derived from the "soft_value" provided by a SOVA detector are accumulated, optionally used to generate a histogram, and then monitored as a performance measure for tuning the channel and recording system optimally. The reliability values may be provided by the SOVA detector, for example, in the form of log likelihood ratios (LLRs). The SOVA detector could be replaced by another soft-output detector, such as a maximum-a-posteriori (MAP) detector, as would be apparent to a person of ordinary skill.

In one exemplary implementation of the invention, a threshold device is employed that can be programmed to a range of values covering the reliability mapping. A counter is configured to count the number of occurrences at each threshold setting. In this manner, a histogram of reliability values can be generated. The shape of this histogram can be interpreted as a relative measure of performance. Even in cases where there is no measureable BER, the histogram information can be used to find optimal settings for the channel parameters by comparing the resultant histograms of different settings. The granularity of the histogram could be increased beyond the number of thresholds plus 1 (see, FIG. 2), for example, by multiple reads of the same data with different threshold settings.

Figure 1:
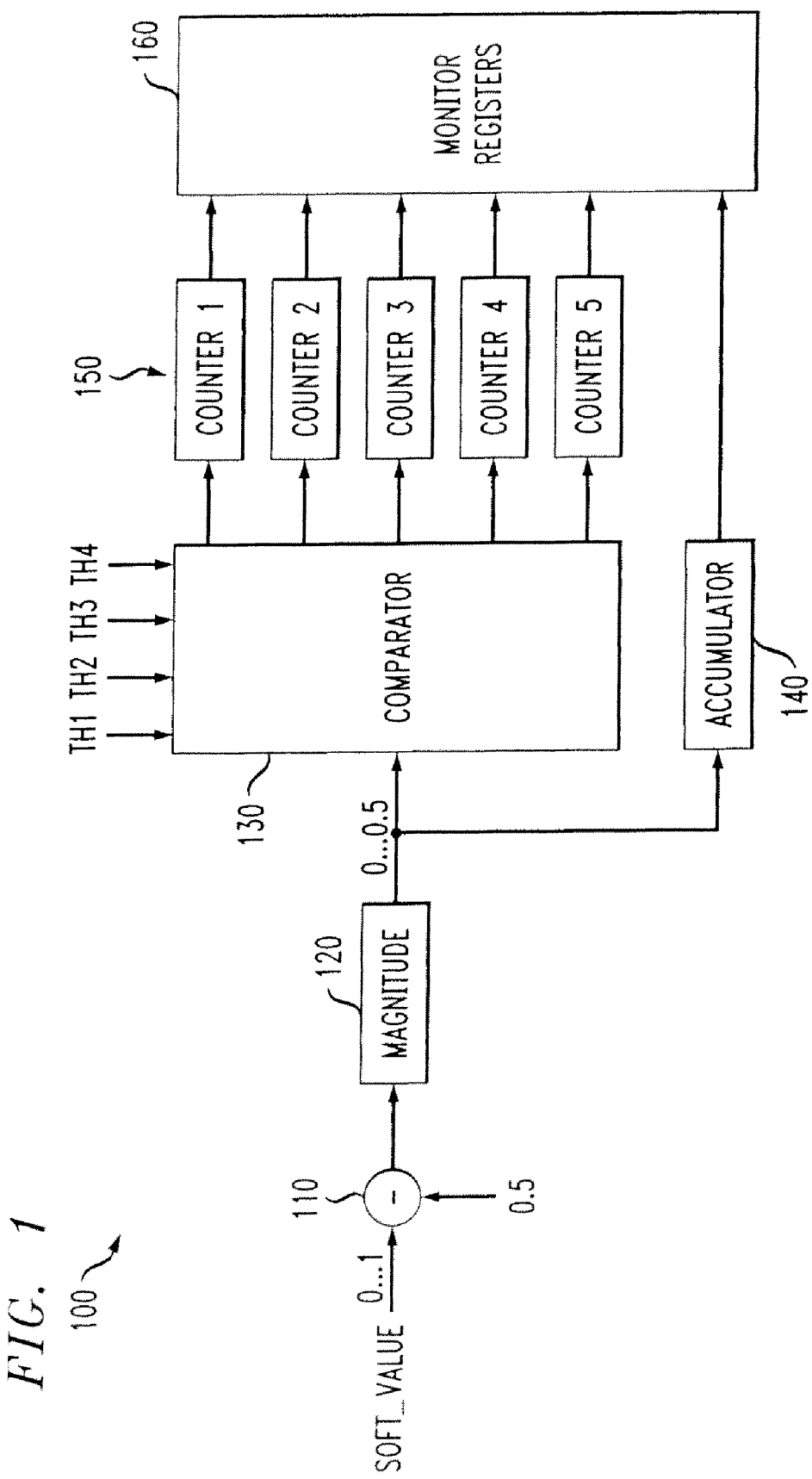
FIG. 1 is a schematic block diagram illustrating a reliability monitor incorporating features of the present invention.

FIG. 1 is a schematic block diagram illustrating a reliability monitor 100 incorporating features of the present invention. The reliability monitor 100 may be incorporated, for example, as part of a SOVA detector, such as those described in J. Hagenauer and P. Hoeher, "A Viterbi Algorithm with Soft-decision Outputs and its Applications," IEEE Global Telecommunications Conference (GLOBECOM), vol. 3, 1680-1686 (November 1989), as modified herein to provide the features and functions of the present invention. As shown in FIG. 1, the exemplary reliability monitor 100 produces soft bit decision values, labeled as "soft_values" in FIG. 1. Generally, the reliability monitor 100 accumulates and histograms the generated reliability information (based on the soft_values).

For each bit decision, the reliability monitor 100 generates a soft-value that is between 0 and 1, where 0 or 1 denotes the highest probability for the detected bit being 0 or 1, respectively, and where a value of 0.5 denotes the lowest possible bit reliability. The reliability value is computed by a subtractor 110 as follows:

reliability_value=|soft_value−0.5|, where the computed reliability_value signal is between 0 and 0.5 and is proportional to the bit reliability. An accumulator 140 accumulates several samples of the reliability_value signal and provides the accumulated values to a set of monitor registers 160. The accumulator 140 can optionally be automatically reset each time its associated monitor register is read out.

A comparator 130 compares the reliability_value against a number of programmable thresholds that define generally non-overlapping ranges, discussed below in conjunction with FIG. 2, such as between 0 and 0.5. In the exemplary embodiment of FIG. 1, the comparator 130 employs four programmable threshold values th1, th2, th3, and th4, thereby defining five distinct ranges, Range 1 to Range 5.

As discussed further below in conjunction with FIG. 2, a bank of counters 150 counts the number of occurrences of the reliability_value in each defined range. For example, a first counter 150-1 counts the number of occurrences of the reliability_value in a first range, Range 1. The bank of counters 150 provide the count values to the set of monitor registers 160. For example, the counter values can be read out through a bit-serial or a byte-parallel register configuration interface by providing a register address to the interface.

The reliability monitor 100 provides a measure of channel performance that is directly correlated to the Bit Error Rate (BER), but takes less time to collect. The channel performance measure can be used, for example, to tune the channel optimally. In one exemplary embodiment, the reliability monitor 100 accumulates normalized LLR values provided by a SOVA detector, which may be, for example, between 0 and 1, and the comparator 130 compares them against a number of threshold values. In an alternate implementation, the reliability monitor 100 can accumulate measured LLR values provided by a SOVA detector, which may be, for example, in a range between −32 to +31 or −64 to +63.

Figure 2:
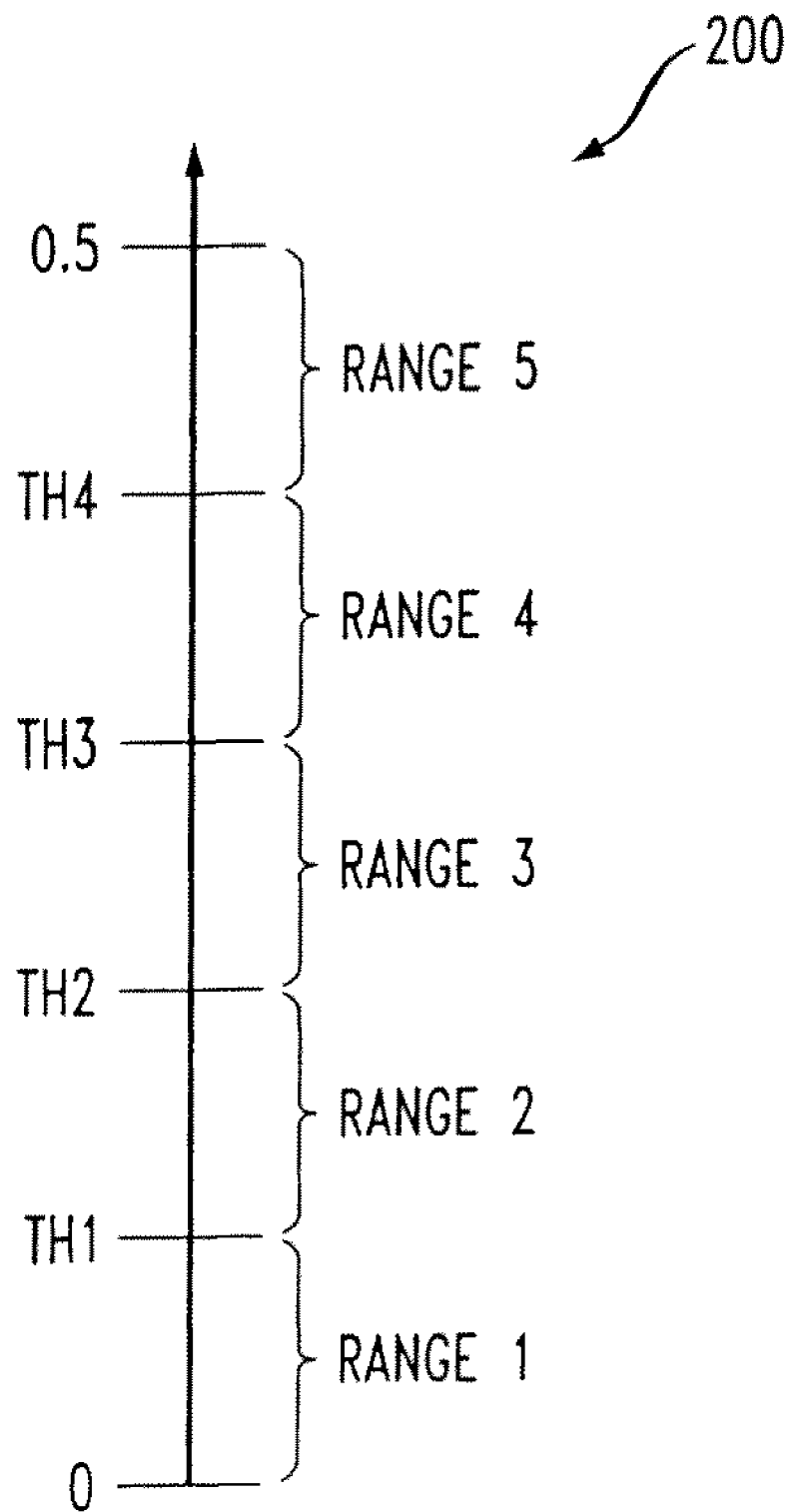
FIG. 2 illustrates a number of exemplary ranges defined by the programmable threshold values used by the comparator of FIG. 1.

FIG. 2 illustrates a number of exemplary ranges 200 defined by the programmable threshold values used by the comparator 130 of FIG. 1. As shown in FIG. 2, the comparator 130 can employ five distinct ranges defined by the four exemplary threshold values th1, th2, th3, and th4.

For example, Counter 1 (the first counter in the bank 150 of counters) counts the number of time that the computed reliability_value is within Range 1, i.e., $0 \leq |soft\_value-0.5| < th1$. Counter 2 counts the number of time that the computed reliability_value is within Range 2, i.e., $th1 \leq |soft\_value-0.5| < th2$. Counter 3 counts the number of time that the computed reliability_value is within Range 3, i.e., $th2 \leq |soft\_value-0.5| < th3$. Counter 4 counts the number of time that the computed reliability_value is within Range 4, i.e., $th3 \leq |soft\_value-0.5| < th4$. Counter 5 counts the number of time that the computed reliability_value is within Range 5, i.e., $th4 \leq |soft\_value-0.5| \leq 0.5$.

Figure 3:
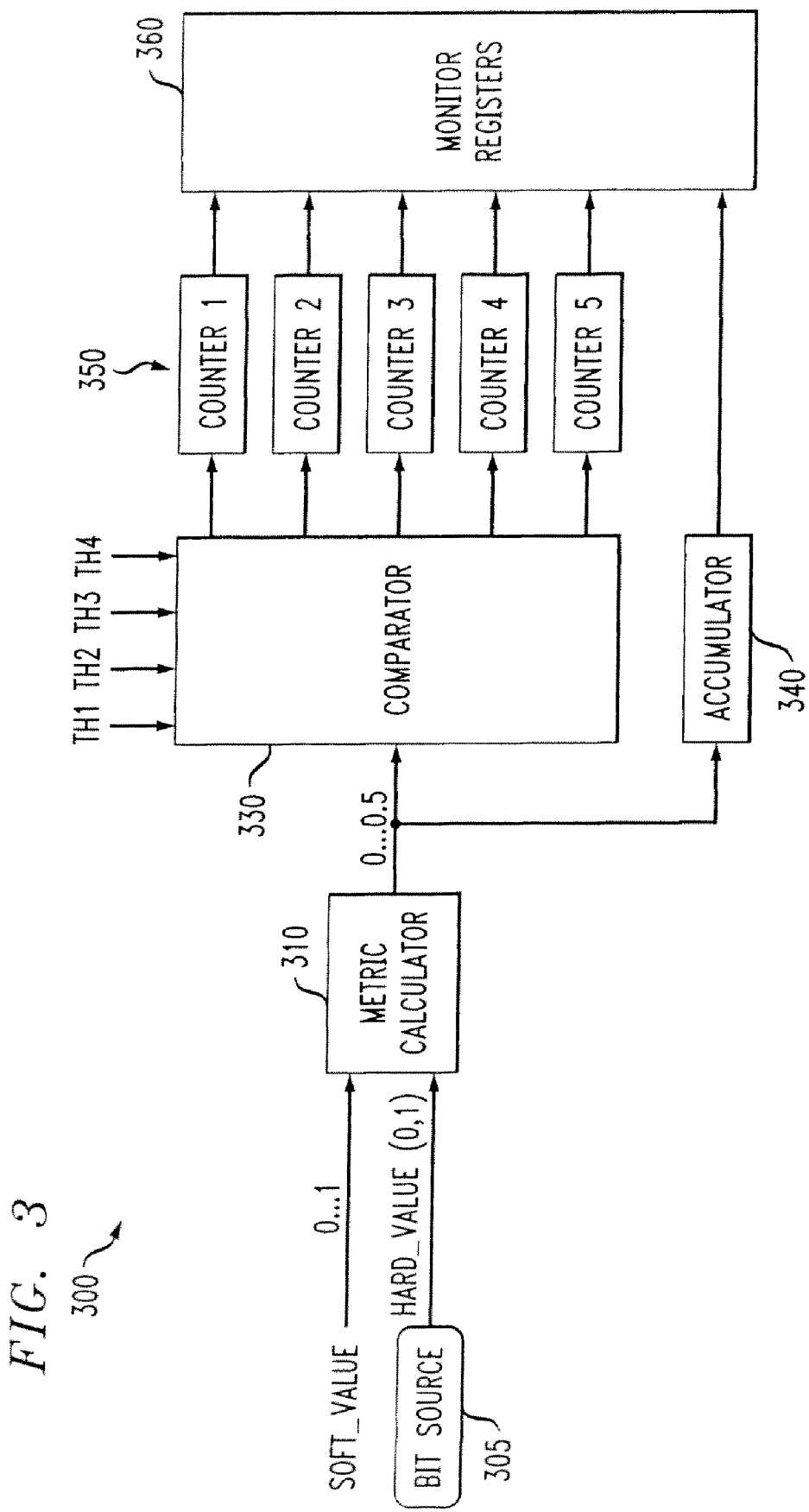
FIG. 3 is a schematic block diagram illustrating a portion of a reliability monitor in accordance with an alternate implementation of the present invention.

FIG. 3 is a schematic block diagram illustrating an alternate reliability monitor 300 incorporating features of the present invention. As shown in FIG. 3, the reliability monitor 300 receives both a known bit value (from a bit source 305, such as a bit-sequence generator that produces a known bit-sequence) and a corresponding reliability_value from a SOVA detector, labeled as a "soft_value" in FIG. 3, associated with the bit decision. The same bit-sequence has been previously written to the hard disk and is now read and detected by the SOVA detector. The bit-sequence generator should be synchronized with the bitstream read from the hard disk. The bit sequence generator could be implemented, for example, as a Linear Feedback Shift-Register (LFSR).

In the embodiment of FIG. 3, the reliability_value signal is computed by the metric calculator 310 as follows:

$$reliability\_value = \frac{|soft\_value + hard\_value - 1|}{2}$$

where the hard_value signal is the known bit value provided by the binary Bit Source 305. It is noted that this equation returns a value of 0.5 (highest reliability) if both the soft_value and the hard_value are identical and returns a value of 0 (lowest reliability) if the soft_value is 0 and the hard value is 1 and vice versa. The metric calculator 310 can be described by the following exemplary truth table:

| Input: hard_value | Output: reliability_value |
|---|---|
| 0 | $= \frac{1 - soft\_value}{2}$ |
| 1 | $= \frac{soft\_value}{2}$ |

The remaining elements of FIG. 3 operate in a similar manner to the corresponding elements of FIG. 1.

The performance measure provided by the present invention directly correlates with the BER, as this is the same information that the Viterbi detector uses to make its final decision. In addition, the information can be collected and interpreted more rapidly than the BER. Even in cases where there is no measureable BER, this information can still be used to find optimal settings for the channel parameters by comparing the resultant histograms of different settings.

It is to be understood that the embodiments and variations shown and described herein are merely illustrative of the principles of this invention and that various modifications may be implemented by those skilled in the art without departing from the scope and spirit of the invention.

We claim:

1. A reliability monitor apparatus for measuring performance in a read channel, comprising:
   a counter for determining a number of occurrences of a reliability value in a plurality of ranges, wherein said reliability value is a measure of probability of a bit read on said read channel; and
   a reliability value comparator circuit coupled to said counter, wherein said reliability value is based on one or more soft bit decisions and wherein said number of occurrences is provided to tune a channel and thereby improve a performance of said read channel, wherein said performance is based on said number of occurrences.

2. The reliability monitor of claim 1, wherein said soft bit decision is obtained from a soft output Viterbi detector or a maximum-a-posteriori (MAP) detector.

3. The reliability monitor of claim 1, wherein said soft bit decision, soft_value, is a normalized value between 0 and 1 indicating a probability for a detected bit having a given binary value of 0 or 1, and where a value of 0.5 denotes a lowest possible bit reliability, wherein said reliability value is computed as follows:

$$\text{reliability\_value} = |\text{soft\_value} - 0.5|.$$

4. The reliability monitor of claim 1, wherein said reliability value is based on a hard bit decision, hard_value, and a corresponding soft bit decision, soft_value, as follows:

$$\text{reliability\_value} = \frac{|\text{soft\_value} + \text{hard\_value} - 1|}{2}.$$

5. The reliability monitor of claim 4, wherein said hard bit decision is obtained from a bit-sequence generator.

6. The reliability monitor of claim 1, wherein said number of occurrences is obtained by comparing said reliability value to a number of threshold values and counting said number of occurrences said reliability value is in each range defined by said thresholds.

7. The reliability monitor of claim 6, wherein said thresholds are programmable.

8. The reliability monitor of claim 6, further comprising means for generating one or more histograms based on one or more of said counted number of occurrences.

9. The reliability monitor of claim 1, further comprising an accumulator to accumulate several samples of said reliability value.

* * * * *

UNITED STATES PATENT AND TRADEMARK OFFICE
CERTIFICATE OF CORRECTION

PATENT NO.        : 7,941,732 B2
APPLICATION NO.   : 12/750049
DATED             : May 10, 2011
INVENTOR(S)       : Nils Graef et al.

It is certified that error appears in the above-identified patent and that said Letters Patent is hereby corrected as shown below:

On the Title page, Item (56) In References Cited, "Welland et al" should be replaced by
-- Wekkand et al --.

Signed and Sealed this
Eighteenth Day of December, 2012

David J. Kappos
*Director of the United States Patent and Trademark Office*